United States Patent [19]

Rubey

[11] 3,913,630

[45] Oct. 21, 1975

[54] MANUAL STRINGER

[75] Inventor: Ulyss Ray Rubey, Lewisville, Tex.

[73] Assignee: United Wiring & Manufacturing Co., Inc., Garland, Tex.

[22] Filed: June 20, 1974

[21] Appl. No.: 481,456

[52] U.S. Cl. .................. 140/123; 140/53; 29/203 H
[51] Int. Cl.[2] .......................................... B21F 23/00
[58] Field of Search .......... 140/53, 117, 123, 123.5; 242/96, 153; 29/203 H; 81/3 J

[56] References Cited

UNITED STATES PATENTS

| | | | |
|---|---|---|---|
| 631,681 | 8/1899 | Stoddard | 140/53 |
| 2,393,910 | 1/1946 | Karle | 242/96 |
| 2,504,669 | 4/1950 | Elliott et al. | 242/96 |
| 3,211,189 | 10/1965 | Wheeler | 140/123 |
| 3,262,193 | 7/1966 | Goldman et al. | 140/122 |

*Primary Examiner*—Lowell A. Larson
*Attorney, Agent, or Firm*—Richards, Harris & Medlock

[57] ABSTRACT

A wire stringing tool for preparing a test or prototype circuit board that simplifies the manual stringing of current conducting wire between and around component leads inserted through plated holes in the board. The tool is a hand-held device comprising a replaceable spool wound with a supply of wire that is threaded through a tube assembled into the body of the tool. A spool housing clasp, which pivots away from the body of the tool to provide for easier threading, is equipped with an adjustable tension control to create tension in the wire during wire stringing operations. A stylus tip is attached to the body of the tool to facilitate the manual operation of routing the wire around terminals and along guide strips.

7 Claims, 2 Drawing Figures

MANUAL STRINGER

FIELD OF THE INVENTION

This invention relates to tools for wiring electronic circuit boards, and more particularly to hand-held wiring tools providing a simple and rapid method for manually interconnecting component leads on electronic circuit boards.

PRIOR ART

Heretofore various techniques have been proposed for making circuit connections in electrical circuits. In one technique, circuit elements are mounted on insulated boards and connections are made by soldering leads of the elements to conductive paths plated onto the boards. Circuit paths may be formed through interconnected, plated-through holes to either side of the board. The resulting assembly is typically referred to as a printed circuit.

The printed circuit technique was developed to provide for a large number of connections without requiring manual wire stringing, which in the past has been a slow and laborious process.

With the development of integrated circuits having many external connections, the size of the packaging assembly required to interconnect the multi-connection circuits became prohibitive. Another technique thus evolved in which an assembly of two or more printed circuit boards are stacked and circuit connections are then provided between the boards.

The development of large scale integrated circuits further increased the number of external connections to a circuit chip. Space limitations and the inherent need for closely spaced terminal connections made the use of printed circuit boards more difficult. Thus, a mounting board structure using wire stringing techniques to keep the board dimensions small was sought.

In one such board structure, components are attached to conductive areas on a circuit board in accordance with the method described in U.S. Pat. No. 3,626,086, wherein rows of solder pads are plated onto one side of a board. Metal strips with protruding fingers on opposite sides of the strip are positioned between the rows of solder pads. Insulated wire is then strung between solder pads by soldering one end of the wire to a pad, passing the wire around and between the fingers and thence to another pad where it is again soldered. After all of the connections necessary for the particular assembly have been thus formed, conducting leads of the circuit components are soldered to the wire to complete the assembly.

Another board structure is shown in U.S. application Ser. No. 318,589; filed Dec. 26, 1972; Attorney Docket No. B2438. Aligned conductive areas are plated onto the opposite sides of an insulative board. Holes are formed through the board with plating extending through each hole to interconnect the aligned conductive areas on the opposite sides of the board. Guide strips having central upstanding fingers with opposed downwardly inclined surfaces are mounted on one side of the board. Component leads are inserted into the holes in the board from the side opposite the guide strips. Insulated wire is then passed around the conductive leads and around the guide fingers along predetermined paths. The wires following orthogonal paths are then soldered to pads, and wires following diagonal paths are severed to leave desired interconnections in place.

Such wire stringing structures are easily adaptable to automated wiring systems such as numerically controlled machines used in mass production. However, the laborious and time consuming hand wiring techniques of the past make the use of such structures difficult for the engineer building a prototype or the small manufacturer assembling only a few devices.

The present invention provides a simple, effective and rapid alternative to automated wiring systems, wherein a single hand-held tool is used to both supply and guide the wire during manual stringing operations.

Both the American Machinist, Sept. 3, 1973, page 57, and Electronic Design, Dec. 20, 1973, volume 21, number 26, page 114, disclose hand-held tools for wiring circuit boards. Both tools include a spool holder mounted on a pencil-like shank through which the wire is threaded. The wire issues through a tip of the pen to permit wire-wrapping or routing. The present invention is believed to be prior in time to the tools disclosed in the publications, and provides improvements over such tools.

SUMMARY OF THE INVENTION

The present invention comprises a hand-held tool which both simplifies and expedites the manual wiring of electronic circuit boards. More particularly, a replaceable spool of wire is located within a spool housing clasp mounted on a hollow handle having a longitudinally grooved portion at one end and a portion of increased size at the other end. Wire is threaded through a hollow member contiguously seated within the handle and having a conical tip extending beyond the grooved portion of the handle.

In one aspect of the invention, a second hollow member is contiguously seated within the first hollow member and extends beyond the conical tip of the first member to form a stylus tip having an end portion bent downward to facilitate the routing of wire around component leads and along guiding combs.

In another aspect of the invention, there is provided an adjustable control to vary the tension in wire being strung. The spool is mounted between the outer legs of the housing clasp by means of a threaded screw extending through the spool and the clasp legs. As the screw is rotated into a retainer attached to the outer surface of an opposing leg, friction pads positioned between the legs and the spool surfaces are forced against the spool to provide a drag opposing spool rotation.

In still another aspect, the spool housing is pivotally attached to the tool handle for easier threading of the wire through the handle.

DESCRIPTION OF THE DRAWINGS

For a more complete understanding of the present invention and for further objects and advantages thereof, reference may now be had to the following description taken in conjunction with the accompanying drawings in which.

DESCRIPTION OF A PREFERRED EMBODIMENT

Figure 1:
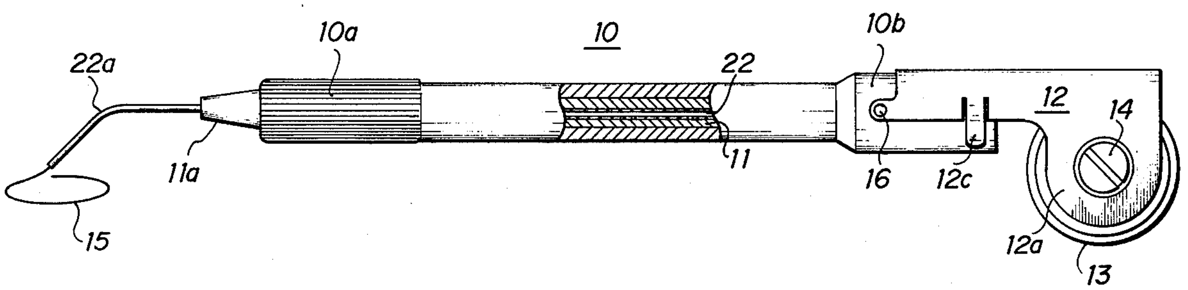
FIG. 1 is a side pictorial view of an embodiment of the invention partially cut away to expose a sectional side view of the tool interior.
Figure 2:
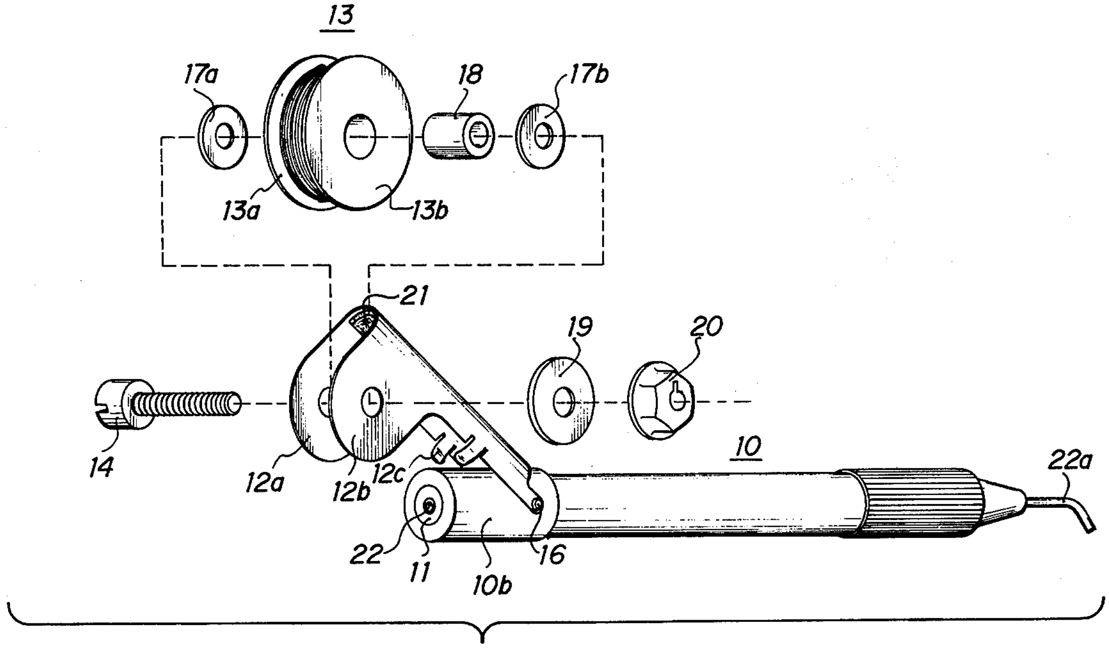
FIG. 2 is a pictorial view from the rear of the embodiment of FIG. 1 with an exploded view of component parts attached to the spool housing clasp which is pivoted away from the handle of the tool.

FIGS. 1 and 2 illustrate a wire stringing tool comprising a hollow handle having a preferred cylindrical shape and generally referred to by reference number 10, a conical tip 11*a*, a stylus tip 22*a*, and a pivotally mounted spool housing clasp generally referred to by reference number 12.

Referring to the Figures, handle 10 comprises a smooth cylindrical body having at one end a longitudinally grooved portion 10*a*, and at the opposite end an increased radius portion 10*b* to which spool housing 12 is attached.

Housing 12 is an arch with axial length sufficient to both be in partial registration with handle portion 10*b* and house a spool 13 in a position longitudinally adjacent to portion 10*b*. At one end, lips 16 extend axially from opposing legs of housing 12 and are pivotally affixed to handle portion 10*b*. Extending traversely along the opposing legs at the opposite end of housing 12 are disk-shaped flanges 12*a* and 12*b*, between which spool 13 is mounted by means of a tension screw 14. Between lips 16 and flanges 12*a* and 12*b*, are fingers 12*c*, which are stamped out portions of housing 12 configured to clasp portion 10*b* about part of its circumference.

As better illustrated in FIG. 2, a hollow member 11, preferably a steel tube, is concentrically seated within a passage or tunnel of handle 10. Tube 11, subtended at one end by a conical tip 11*a*, extends the longitudinal length of handle 10.

Concentrically seated within member 11 is a hollow member 22, preferably a steel tube, forming a tunnel and extending the longitudinal length of handle 10 for a distance beyond tip 11*a* to form a downward bent stylus tip 22*a* through which wire 15 issues.

Wire 15 is carried by and supplied from a replaceable spool 13 which is mounted between disk-shaped friction pads 17*a* and 17*b* cemented to the inner sides of legs 12*a* and 12*b*, respectively, and held in place by tension screw 14.

Threaded tension screw 14 passes in order through leg 12*a*, friction pad 17*a*, a hollow cylindrical sleeve 18 loosely seated within the axial opening of spool 13, friction pad 17*b*, leg 12*b* and a rubber grommet 19. Screw 14 is held in place by a retainer 20 adjacent to grommet 19.

Tension control during a wire stringing operation is controlled by screw 14 acting in conjunction with friction pads 17*a* and 17*b*. As screw 14 is turned clockwise, rims 13*a* and 13*b* of spool 13 are forced against pads 17*a* and 17*b*, respectively. A controlled drag thus opposes the rotation of spool 13 to create tension in wire 15 during the wire stringing operation.

For an essentially noiseless operation, a sponge 21 is cemented to the inner wall of the apex of housing 12 to act as a buffer between rims 13*a* and 13*b* of spool 13 and the housing.

In operation, housing 12 is pivoted away from handle 10 to thread wire 15 into tube 22 and through tip 22*a*. Housing 12 is then pivoted back into operating position where fingers 12*c* encircle part of the circumference of handle portion 10*b* to hold housing 12 in place. Next, screw 14 is turned to adjust the tension in wire 15, and the tool is grasped about handle portion 10*a* to begin a wire stringing operation.

In accordance with the invention, there is provided a hand-held, wire stringing tool for simply and expeditiously wiring a circuit board. The tool includes a hollow main body handle having a stylus tip at one end and a pivotally mounted spool housing clasp at the opposite end. The spool housing may be pivoted away from the main body of the tool for easier threading of wire through the tool, and clasped to the handle during a wire stringing operation. Tension in the wire may be controlled by a tension screw holding a replaceable spool of wire within the housing, and acting in conjunction with friction pads cemented to the inner walls of the housing to create drag opposing spool rotation.

Having described the invention in connection with certain specific embodiments thereof, it is to be understood that further modifications may now suggest themselves to those skilled in the art and it is intended to cover such modifications as fall within the scope of the appended claims.

What is claimed is:

1. A wire stringing tool to be used in manually interconnecting component leads on an electronic circuit board, which comprises:

a handle having a smooth bore tunnel of substantially uniform diameter extending along its longitudinal axis from a wire storage end to a wire feeding tip;

a spool carrying a supply of wire for use in a stringing operation;

a spool housing rotatably carrying said spool and pivotally mounted on said handle at the wire storage end and including first and second extending fingers to clasp the handle thereby positioning said spool for discharge of a wire through the smooth bore tunnel; and means for controlling drag opposing rotation of said spool.

2. The combination of claim 1 wherein said handle has a conical tip at one end through which the wire is to issue.

3. The combination of claim 2 wherein a stylus tip is affixed to said conical tip to further facilitate guiding the wire during stringing operations.

4. The combination of claim 1 wherein a first hollow member extended at one end by a conical tip is contiguously seated within and extends the length of said tunnel, and a second hollow member is contiguously seated within and extends the length of said first member and a distance beyond to form a downward bent stylus tip through which wire is to issue.

5. The combination of claim 1 wherein said means for controlling includes a screw acting in conjunction with a pair of friction pads mounted on either side of said spool and cemented to inner walls of said housing.

6. A hand-held wire stringing tool, which comprises:

a. a handle having a longitudinally grooved portion at one end and a portion of increased size at the opposite end, and having a passage along its longitudinal axis extending the length of said handle from a wire supply end to a wire feed end;

b. a first hollow member contiguously seated within and extending the full length of said passage, and subtended by a conical tip extending a distance beyond said handle;

c. a second hollow member contiguously seated within and extending the full length of said first member and a distance beyond said conical tip to form a downward bent stylus tip through which wire is to issue;

d. a spool housing clasp pivotally attached to said portion of increased size and extending longitudinally beyond said handle;

e. a spool rotatably mounted within said housing in close proximity to the wire supply end of said handle; and f. control means for varying the drag opposing the rotation of said spool.

7. The combination of claim 6 wherein said control means includes a threaded screw held in place by a retainer and passing transversely through said clasp, said spool, and through a pair of friction pads cemented to said clasp on either side of said spool.

* * * * *